(12) United States Patent  (10) Patent No.: US 6,642,618 B2
Yagi et al.  (45) Date of Patent: Nov. 4, 2003

(54) LIGHT-EMITTING DEVICE AND PRODUCTION THEREOF

(75) Inventors: Takaaki Yagi, Saitama (JP); Takeshi Tamura, Tokyo (JP); Fusanori Arakane, Musashino (JP)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 09/879,548

(22) Filed: Jun. 11, 2001

(65) Prior Publication Data

US 2002/0070449 A1 Jun. 13, 2002

(30) Foreign Application Priority Data

Dec. 21, 2000 (JP) ........................................ 2000-388463

(51) Int. Cl.[7] .............................................. H01L 23/48
(52) U.S. Cl. ...................................... 257/734; 257/794
(58) Field of Search ................................. 257/734, 673, 257/646, 676, 696, 692–693, 698, 787, 794, 666, 99, 688, 100

(56) References Cited

U.S. PATENT DOCUMENTS

| | | | | |
|---|---|---|---|---|
| 5,923,080 A | * | 7/1999 | Chun | 257/666 |
| 5,957,560 A | | 9/1999 | Do et al. | |
| 6,137,174 A | * | 10/2000 | Chiang et al. | 257/734 |
| 6,177,726 B1 | * | 1/2001 | Manteghi | 257/725 |
| 6,180,962 B1 | * | 1/2001 | Ishinaga | 257/99 |
| 6,212,213 B1 | | 4/2001 | Weber et al. | |
| 6,252,254 B1 | | 6/2001 | Soules et al. | 257/89 |
| 6,273,589 B1 | | 8/2001 | Weber et al. | 362/293 |

FOREIGN PATENT DOCUMENTS

| | | |
|---|---|---|
| JP | 10-242513 | 9/1998 |
| JP | 11-204838 | 7/1999 |
| JP | 11-251640 | 9/1999 |
| WO | WO 00/33389 | 6/2000 |
| WO | WO 00/33390 | 6/2000 |

OTHER PUBLICATIONS

10–242513, Sep. 11, 1998, Patent Abstracts of Japan.
11–204838, Jul. 30, 1999, Patent Abstracts of Japan.
11–251640, Sep. 17, 1999, Patent Abstracts of Japan.

* cited by examiner

*Primary Examiner*—Wael Fahmy
*Assistant Examiner*—(Vikki) Hoa B. Trinh
(74) *Attorney, Agent, or Firm*—Patent Law Group LLP; Brian D. Ogonowsky; Rachel V. Leiterman

(57) ABSTRACT

A light-emitting device comprises a substrate, electrical terminals disposed on a top side of the substrate, and a light-emitting semiconductor device disposed above the substrate. The light-emitting semiconductor device has a bottom side oriented to face toward the top side of the substrate. Electrodes are disposed on the bottom side of the light-emitting semiconductor device and electrically connected to the terminals on the substrate. A glass layer is arranged in a path of output light emitted by the light-emitting semiconductor device. The glass layer contains fluorescent material that converts at least a portion of the output light to converted light having a wavelength different from a wavelength of the output light. The fluorescent material may include $SrS:Eu^{2+}$ that emits red light and $(Sr, Ba, Ca)Ga_2S_4:Eu^{2+}$ that emits green light.

20 Claims, 3 Drawing Sheets

LIGHT-EMITTING DEVICE AND PRODUCTION THEREOF

FIELD OF THE INVENTION

The present invention relates to a light-emitting device, termed a white LED, comprising a semiconductor light-emitting element light source, and a fluorescent material that receives output light therefrom and that emits fluorescent light of a different wavelength than this output light, the light from the light-emitting element and the light from the fluorescent material being combined to produce white light.

BACKGROUND

A number of white LEDs—light-emitting devices that use semiconductor lightemitting elements to produce white light—have been proposed to date. The use of semiconductor light-emitting elements affords relatively intense light with low electrical power consumption. Further, unlike incandescent bulbs or fluorescent lights, such devices to not radiate heat, and do not experience problems such as deterioration with time or burning out. Applications for such devices are thus expanding rapidly. Japanese Patent No. 2927279 discloses a technique for producing a white LED using a semiconductor light-emitting element. This patent teaches combining blue light (output by a gallium nitride semiconductor element) with yellow light having a broad spectrum component (output by a YAG fluorescent material which is excited by blue light output) to produce white light. In this prior art, the white LED is produced by arranging the semiconductor element on a substrate and encapsulating it in a transparent resin containing YAG fluorescent material.

Light sources that use gallium nitride semiconductor elements have longer life than the incandescent bulbs and fluorescent lights currently used as light sources for illumination, and can be used for up to about 10 years.

However, the light-emitting devices disclosed to date employ a resin protective layer (molding) to protect the light-emitting diode, and this poses a number of problems. For example, where the protective layer is composed of a resin, water can penetrate in the course of service over several years, impairing operation of the light-emitting diode; or where the output light of the light-emitting diode is ultraviolet, the ultraviolet can eventually cause discoloration, reducing ability to transmit output light from the light-emitting diode, and substantially impairing light-emitting diode performance.

In another aspect, the YAG fluorescent material disclosed in the prior art emits a broad spectrum of light centered around yellow. However, color rendering is poor, as noted. With the aim of improving color rendering, the Applicant has proposed a light-emitting device that combines two fluorescent materials, a green-and a red-light emitting material. However, these fluorescent materials have poor moisture resistance, so moisture countermeasures are crucial. However, light-emitting device designs proposed to date do not afford adequate moisture permeability.

In view of the problems with resin light-emitting diode protective layers, Unexamined Patent Application (Kokai) 11-251640 and Unexamined Patent Application (Kokai) 11-204838 disclose protective layers for protecting light-emitting diodes. These Applications were proposed in view of the drawbacks of the resin light-emitting diode protective layer disclosed in the aforementioned patent, namely, susceptibility to permeation by moisture—i.e., poor environmental resistance—and discoloration with massive exposure to ultraviolet—i.e., poor ultraviolet resistance—, resulting in diminished transparence and impaired characteristics as a light-emitting diode, and teach encapsulating the light-emitting diode with sol-gel glass rather than with a resin protective layer.

However, the light-emitting devices disclosed in Unexamined Patent Application (Kokai) 11-251640 and Unexamined Patent Application (Kokai) 11-204838 have the following problems.

Where wire bonding is employed to provide reliable electrical contact of the light-emitting diode, encapsulating the light-emitting diode with sol-gel glass using the methods disclosed in the above publications poses the following potential problems.

Where wire bonding is employed to provide reliable electrical contact of the light-emitting diode with an outside power supply, the wires from the light-emitting diode must pass through both glass and epoxy in order to connect with the leads outside the light-emitting diode. However, as the glass and epoxy resin have different qualities, such as coefficients of thermal expansion and hygroscopicity, significant stresses may be created within wires at the glass-epoxy interface, possibly severing the wires. Where sol-gel glass is used, volume shrinks by about 30% during hardening, so breakage resulting from stresses created in the wire can occur during molding as well. Thus, where wire bonding is employed to provide reliable conduction paths, differences in physical properties at the glass layer/epoxy cap interface can result in the problem of wire breakage.

In short, with light-emitting devices employing semiconductor light-emitting elements, while the semiconductor elements per se have high reliability and extended life, the packaging used to protect the semiconductor light-emitting element and ensure electrical contact with an outside power supply tends to experience problems in terms of reliability.

While it would be possible to address this problem by using a thicker glass layer to create the interface, it is difficult to produce thick glass that is free of cracks.

SUMMARY

With the foregoing in view, it is an object of the present invention to provide highly reliable packaging for semiconductor light-emitting elements, and to thereby provide a light-emitting device employing a semiconductor light-emitting element that offers sustained high performance and extended service life.

This object herein is achieved through a semiconductor light-emitting device wherein a semiconductor light-emitting element flip-chip is electrically interconnected to terminals on a substrate, said device comprising: a light-emitting element consisting of a gallium nitride semiconductor element; and a glass layer arranged on the path of the light output by said light-emitting element and containing a fluorescent material for receiving said output light and producing converted light converted to a wavelength different from that of said output light; wherein said emitted light and said converted light are used to produce essentially white light.

In preferred practice, the substrate will be a printed board.

In a preferred embodiment, the fluorescent material will consist of two sulfur-containing compositions, each fluorescent material producing converted light of a different wavelength.

One of the two fluorescent materials may be $SrS:Eu^{2+}$ that emits red fluorescent light, with the other being $(Sr, Ba, Ca)Ga_2S_4:Eu^{2+}$ that emits green fluorescent light.

The green fluorescent material may consist of SrGa$_2$S$_4$:Eu$^{2+}$. In a preferred embodiment, the glass layer containing the fluorescent material will have a thickness of 100 μm or less.

In a preferred embodiment, the glass layer will consist of SiO$_2$ containing at least one compound selected from the group consisting of PbO, Ga$_2$O$_3$, Bi$_2$O$_3$, CdO, ZnO, BaO, and Al$_2$O$_3$; or of SiO$_2$ substantially devoid thereof.

Glass layer composition may be manipulated by including compounds selected from PbO, Ga$_2$O$_3$, Bi$_2$O$_3$, CdO, ZnO, BaO, and Al$_2$O$_3$. The reason for doing this is as follows. Reflection occurs at the interface of the light-emitting element and the surrounding glass layer or other packaging material. The proportion of total reflection occurring is higher the greater the difference in refractive index. Total reflection results in light bouncing back and forth within the package so that the efficiency of light emission to the outside declines. Accordingly, it is desirable to minimize total reflection at interfaces through which light from the light-emitting element passes, so as to achieve efficient transmission of light from the light-emitting element to the air. In order to achieve this it is necessary to minimize refractive index differential at each interface. Where a light-emitting element structure comprises two layers—a light-emitting element and a glass layer—two interfaces are present, one of the light-emitting element with the glass layer and one of the glass layer with the air layer, so in order to minimize reflection of light from the light-emitting element, it is desirable to minimize refractive index differential at each of the two interfaces.

Accordingly, the refractive index of the glass layer preferably lies between the refractive indices of air and that of the light-emitting element.

By providing the surface of the element with the aforementioned oxide having a refractive index lying between the refractive index of air and the refractive index of the light-emitting element, and using this as a non-reflective coating to increase the efficiency of light emission to the outside, light output can be improved on the order of several ten percent. The advantages of using glass coating rather than encapsulation with epoxy are that:

1) environmental resistance is improved; 2) operation at high temperatures becomes possible; and 3) materials affording higher efficiency of light emission can be selected. The refractive indices of epoxies in no event exceed about 1.6. The refractive index of air is 1.0, and the refractive indices of compound semiconductors used in light-emitting diodes range from about 3.4 to 1.8. The refractive index of the SiO$_2$ of the glass layer is about 1.5, but where the SiO$_2$ contains a transparent compound such as PbO, Ga$_2$O$_3$, Bi$_2$O$_3$, CdO, ZnO, BaO, or Al$_2$O$_3$, the refractive index can be increased to about 1.5 to 2.5. Thus, by including a transparent compound such as PbO, Ga$_2$O$_3$, Bi$_2$O$_3$, CdO, ZnO, BaO, or Al$_2$O$_3$ in SiO$_2$, the refractive index of the glass layer can be controlled to a desired level so as to maximize the efficiency of light emission from the light-emitting element.

Where an additional epoxy layer is provided to the outside of the glass layer, the refractive index at the interface of the glass layer with the epoxy layer is considered as well. That is, the refractive index of the glass layer is suitably controlled by manipulating the amount of transparent compound contained therein so as to minimize refractive index at the respective interfaces going from the light-emitting element to the glass layer, epoxy layer, and air. Specifically, the changes in refractive index going from the light-emitting element to the glass layer, epoxy layer, and air will constitute a geometrical series.

As noted, the invention provides a light-emitting device employing a combination of blue light from a gallium nitride LED and light of converted color from a fluorescent material to emit essentially white light. The white LED herein, used in conjunction with a blue LED, serves as a highly reliable, extended life light source for illumination. White LEDs employing high-output blue LEDs as excitation sources can replace fluorescent lamps, incandescent bulbs, or the like. By means of a reliable packaging process, the light-emitting device herein provides a light-emitting device that offers high performance, notwithstanding the use of a combination of fluorescent materials having poor environmental resistance but also affording enhanced color reproduction.

DETAILED DESCRIPTION OF THE EMBODIMENTS

Figure 1:
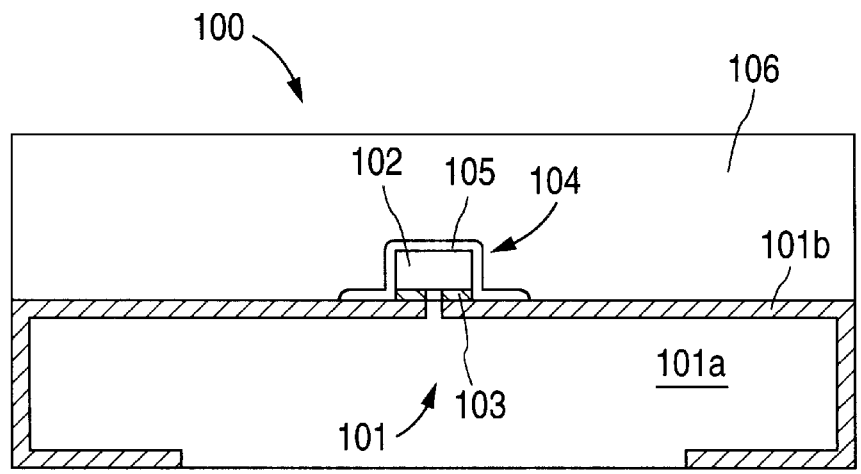
FIG. 1 is a sectional view of a light-emitting device pertaining to a first embodiment of the invention.

The preferred embodiments of the invention are described hereinbelow with reference to the accompanying drawings. A schematic sectional view of the light-emitting device pertaining to a first embodiment of the invention is shown in FIG. 1. This light-emitting device 100 comprises a substrate 101. Substrate 101 is typically a wiring board of epoxy resin or other plastic, but is not limited thereto. The substrate has formed thereon a dielectric layer 101a of plastic or the like, and over the dielectric layer 101a, a suitable pattern of conducting paths 101b, i.e., electrodes or terminals; and supplies electrical power from the outside to a light-emitting element 102 connected thereto. The light-emitting element 102 in the present examples is a gallium nitride semiconductor element, described later, which is mounted on substrate 101 in a flip-chip connection; connection terminals are provided to the bottom face of the chip, and electrical connection is made with electrodes or terminals 101b on the substrate by bonding bumps (solder balls) consisting of a suitable conductive solder, or conductor portions 103 (such as wires) to these terminals. A light-transmissive sol-gel glass layer 105 is formed over the outside of the light-emitting element. A transparent layer 106 is formed over the outside thereof.

Light-emitting Diode

The light-emitting element 101 herein is a light-emitting diode, more specifically, a gallium nitride semiconductor element. The semiconductor element may consist of AlInGaP, InGaN, or the like.

Sol-gel Glass

The sol-gel glass layer 105 herein is now described referring to FIG. 1.

Production of the sol-gel glass is now described. First, an SiO$_2$ gel of network form is prepared by dealcoholation of an alkoxysilane. This gel is dried to give a solidified gel. The resultant material consists of SiO$_2$—the same composition as that of ordinary glass—but sol-gel glasses have a different production process than ordinary glass, in that the use of metal catalysts in the dealcoholation reaction allows $SiO_2$ to be synthesized at low temperatures ranging from ordinary temperature to about 150° C. However, the density differs from that of ordinary glass produced by heating to the $SiO_2$ melting point. Sol-gel glasses are much denser than resins such as epoxies, and have moisture permeabilities lower than those of epoxies by a factor of several tens to several hundreds.

As regards moisture permeability, when a sol-gel glass coating layer several microns thick is formed on a copper plate or nickel plate, and this specimen is exposed to a 60° C., 90% RH atmosphere for 100 hours, no corrosion of the metal is observed. When applied in a layer about 10 microns thick to an aluminum plate and immersed in 100° C. water for 150 hours, aluminum gloss is 95% or above. Since the glass coating is impervious to moisture, no oxidation of metal panel surfaces occurs, as a result of which metal surface smoothness is unimpaired.

Epoxies, on the other hand, absorb about 2 wt % water when held in an 80° C., 85% humidity environment for about 24 hours.

As will be apparent from the preceding, comparative research conducted by the inventors has shown that sol-gel glass coatings offer better resistance to moisture permeation than to epoxy coatings. Specifically, with sol-gel glasses, water does not readily penetrate into the glass and cannot react with the fluorescent material contained therein, thus preventing degradation of the fluorescent material.

Fluorescent Material

The fluorescent material herein is a combination of two fluorescent materials, a blue-excited red fluorescent material and a blue-excited green fluorescent material. The $SrS:Eu^{2+}$ emits red fluorescent light, and the $(Sr, Ba, Ca)Ga_2S_4:Eu^{2+}$ emits green fluorescent light. A specific example of the green fluorescent material is $SrGa_2S_4:Eu^{2+}$ A sol-gel glass layer is formed over the exterior of the light-emitting element 102 herein, this sol-gel glass layering having dispersed therein two fluorescent materials having different fluorescent wavelengths. The use of two fluorescent materials having different fluorescent wavelengths is a characterizing feature of the invention: the fluorescent materials used herein have not been viable for use in the field of the invention due to their chemical instability. With the present invention, however, the use of these chemically unstable fluorescent materials has become viable through combination with encapsulation in glass for stabilizing them.

Figure 2:
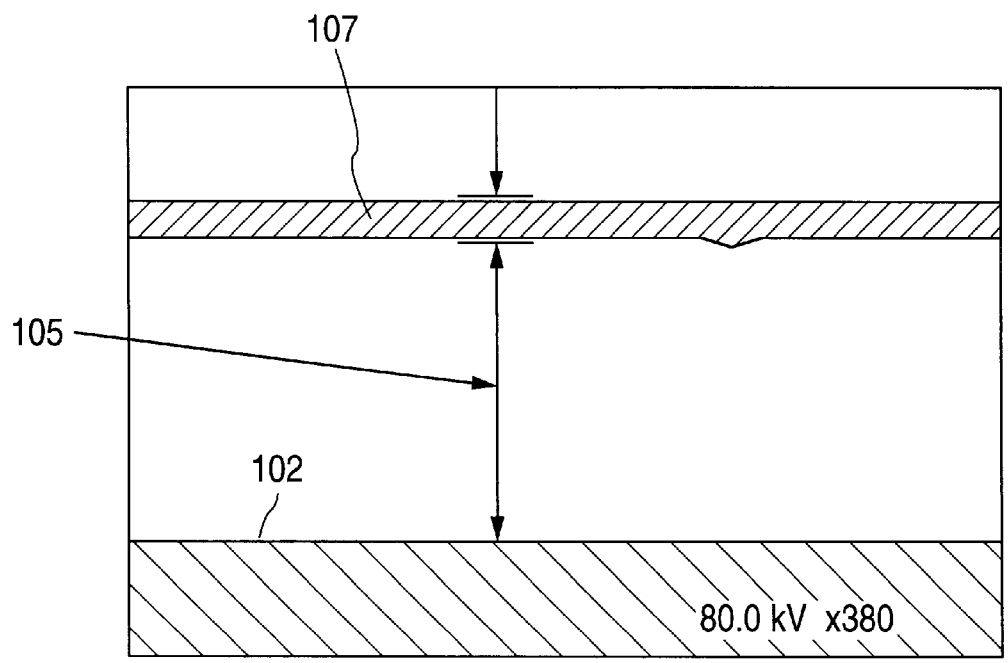
FIG. 2 is a sectional photograph of a glass film containing fluorescent material.

Referring to FIG. 2, the fluorescent material 107 in the present example is dispersed within the glass layer 105 such that the concentration thereof is higher towards the outside surface of the layer than it is close to the light-emitting element surface. On the bottom face of the light-emitting element 102 is formed a reflecting layer having a reflecting face for reflecting light emitted by the light-emitting element 102; the light reflected from the light-emitting element 102 is reflected in the information in FIG. 1. The reflecting layer may also serve as an electrode of the light-emitting element 102, or a separate electrode may be provided.

Production of White LED

In the invention, blue light is generated by a semiconductor light emission source using an InGaN or other gallium nitride semiconductor element. The fluorescent material contains a $SrGa_2S_4:Eu^{2\pm}$ fluorescent portion that emits green fluorescent light upon receiving blue light, and a $SrS:Eu^{2+}$ fluorescent portion that emits red fluorescent light upon receiving blue light; this fluorescent material is contained within the transparent mold layer covering the light-emitting diode to produce a fluorescent material. The white LED herein, which uses this blue light source and combines green fluorescent light and red fluorescent light, features exceptionally good color rendering.

Bumps

Referring to FIG. 1, light-emitting device 100 comprises a light-emitting element composed of a light-emitting element containing SnPb, In, Au, Ag, or the like and encapsulated by a fluorescent material-containing glass layer 105; electrodes or terminals provided on the bottom of light-emitting element 102; and metal bumps 103 situated therebelow for electrical connection. This gives a light-emitting element structure 104. The bumps 103 are typically solder balls about 100 to 300 microns in diameter. Alternatively, gold balls or copper balls may be used. The gallium nitride semiconductor light-emitting element 102 is arranged on substrate 101—which includes the electrical wiring—and is connected with the leads thereof. Semiconductor light-emitting element 102 is arranged over bumps 103 and lead connections, i.e. solder joint connections, are made using the bumps, which are masses of metal situated in the electrode portions of the semiconductor element.

Submount

Figure 3:
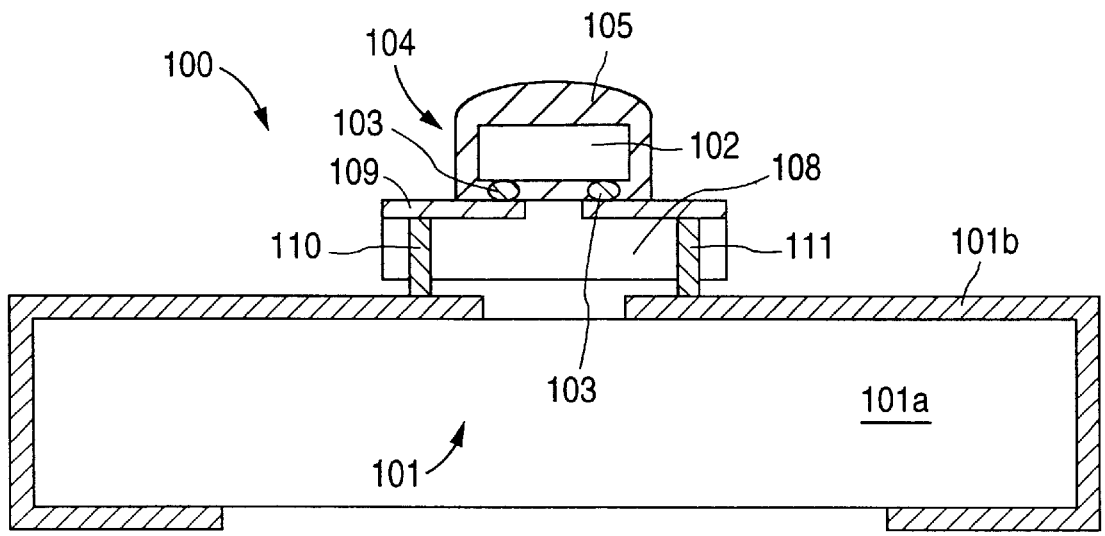
FIG. 3 is a sectional view of a light-emitting device pertaining to another embodiment of the invention.
Figure 4:
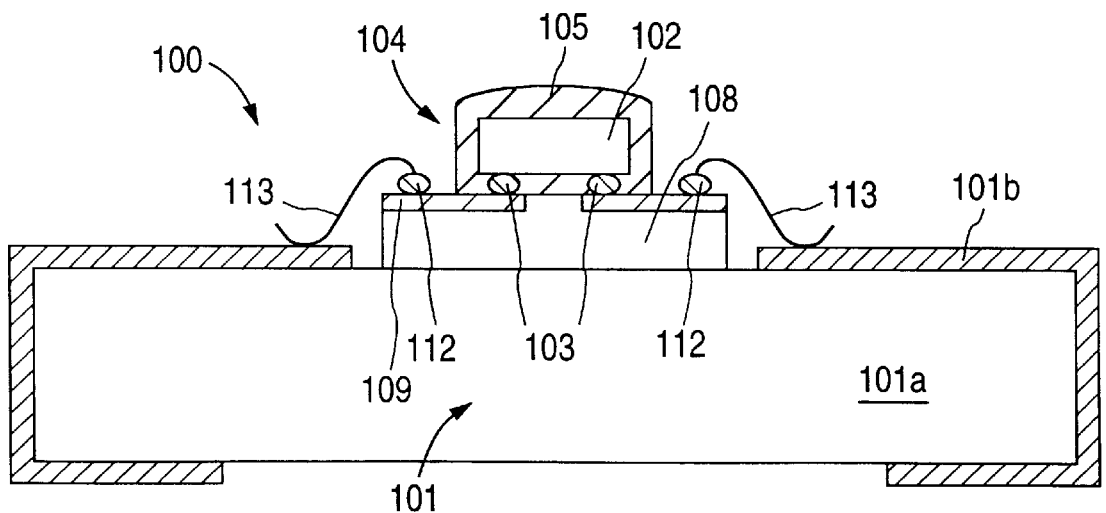
FIG. 4 is a sectional view of a light-emitting device pertaining to yet another embodiment of the invention.

A specific embodiment of light-emitting device structure is a structure wherein the substrate is positioned below this light-emitting element structure, as shown in FIG. 1; as shown in FIG. 3 and FIG. 4, a submount 108 may be interposed between the light-emitting element structure and the substrate. In the present example, submount 108 is about 100 to 200 $\mu$m thick, and is larger in size than the light-emitting element structure. The submount 108 may be fabricated from materials such as silicon, ceramic, metal, etc. In the present example, submount 108 is provided with conducting portions (namely electrode portions 109) for electrical connection with the metal bumps 103 and with conductive paths 110 leading from the electrode portions 109. These conductive paths 110 extend through throughholes 111 provided in the submount and are electrically interconnected with terminal portions 101b provided on the substrate. At the bottom of each through-hole 111 is formed a conductive bump (solder ball) 112—identical to that provided on the bottom of the light-emitting element structure—to produce a conductive path to the substrate 101.

In FIG. 3, substrate 101 has the same construction as the substrate 101 described in FIG. 1, and on the top surface thereof are formed electrical wiring terminal portions, i.e., leads 101b, electrically interconnected to bumps on the bottom of the submount 108.

The substrate 101 used herein is typically a printed board, specifically, a PWB (printed wiring board) termed a "chip LED", rather than a lead frame. The printed circuit board can be manufactured by ordinary processes. On the substrate buried leads 101b are etched into a dielectric layer portion composed of plastic, ceramic, metal, or other material.

The submount arrangement shown in FIG. 4 differs from that in FIG. 3. In the structure shown in FIG. 4, interconnection of the light-emitting element structure to submount 108 is accomplished by solder joints, while interconnection of the submount and substrate is accomplished by wire bonding. The light-emitting device 100 comprises a light-emitting element 102, a fluorescent material-containing glass layer 105 encapsulating it, and terminal portions on the bottom of the light-emitting element 102, as well as metal bumps 103 provided therebelow for electrical interconnection, giving a light-emitting element structure. In the present example, the light-emitting element structure 104 is provided with conducting bumps 103 for electrical interconnection of electrode portions on the bottom of the light-emitting element 102 to electrode portions 109 on the top face of the submount 108, and additional conductive bumps 112—situated on the outside edge of the electrode portion on the top face of submount 108—for electrical interconnection to electrode faces formed on the outside face of the substrate. These outer conductive bumps 112 of submount 108 are connected via wire bonds 113 to an electrode plate 101b on the substrate. The fluorescent material-containing glass layer 105 does not extend as far as the wire bonding portion.

Production of Light-emitting Device

In producing light-emitting device 100, first, a light-emitting device structure of a light-emitting element 102 and a fluorescent material-containing glass layer 105 encapsulating it is formed.

Next, where the structure of the light-emitting device 100 is that depicted in FIG. 1, the light-emitting device structure is electrically connected directly to the electrode portions 101b on the substrate via bumps, without using a submount 108. In the case of the light-emitting devices depicted in FIG. 3 and FIG. 4, the light-emitting device structure must be electrically connected to the electrode portions 101b on the substrate via a submount 108. To this end, solder bumps 103 are formed on the bottom of the light-emitting device structure, i.e., the top face of submount 108, and on the bottom of the submount, i.e., the top face of the substrate PWB. In this case the bumps 103 on the bottom of the light-emitting device structure and the bumps 112 on the top face of the submount 108 are formed separately, the submount 108 is arranged below the light-emitting device structure, conductive paths are established between the light-emitting device structure and the submount 108, and then conductive paths are established between submount 108 and substrate 101. In this way, the light-emitting device structure and the submount 108 bumps are joined to the respective electrode plates.

Where gold bumps are used, joining is typically carried out by applying ultrasound and heat. For solder bumps, stencil mask printing, plating, or other technique is used.

Formation of conducting portions on a substrate by stencil mask printing of solder paste is known in the art. A typical method is the following. First, a mask is placed over the PWB, and solder paste is spread over the mask using a spatula. In this way the solder paste moves onto the PWB (substrate) through the openings in the mask, forming a solder layer on the surface of the PWB. Next, the mask is removed from the PWB so that a solder paste layer forms over predetermined required portions on the PWB. Where a solder ball process is used, solder balls are secured to the PWB or to the element. In this case, solder flux or the like may be used for the solder balls. The element is then mounted at the proper location on the PWB. It is then reflowed to melt the solder and effect connection. A solder plating process may be used as well. In this case, areas on the surface of the PWB where solder is not to be deposited are masked in the same manner as in stencil mark printing. This is followed by electroless plating of solder.

An Exemplary Soldering Method is Now Discussed

First, the element is arranged on the solder, and then charged to a reflow furnace to melt the solder and bond the element to the PWB.

Next, glass containing fluorescent material is applied over the surface of the semiconductor light-emitting element to form a glass layer about 100 µm or less thick. Since the fluorescent material is sensitive to temperature, the production process will preferably be carried out at low temperature. Where a glass sol-gel film production process is used, the glass will be liquid at low temperature, allowing the glass film to be produced at relatively low temperature. The temperature is about 80° C. to 150° C. The fluorescent material is admixed into this glass sol-gel solution, which is then applied and heated to produce a glass body. In this way, glass containing fluorescent material is applied to the surface of the semiconductor chip. The fluorescent material is a combination of two materials, a blue-excited green fluorescent material and a blue-excited red fluorescent material. The chip is a flip-chip. In the process of applying the glass over the surface of the semiconductor chip, flip chip bonding provides better technical compatibility, since the interconnect process does not require the presence of wires. $SrS:Eu^{2+}$ emits red light, and $(Sr, Ba, Ca)Ga_2S_4:Eu^{2+}$ emits green light. A specific example of a green fluorescent material is $SrGa_2S_4:Eu^{2+}$.

Figure 5:
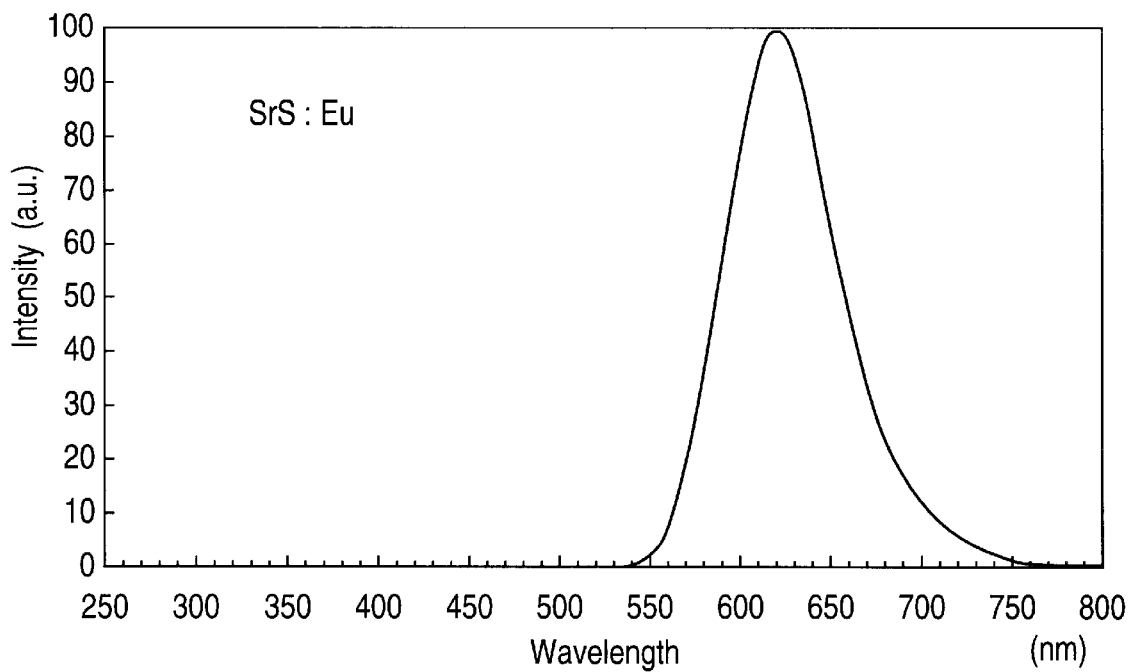
FIG. 5 is a fluorescent material emission spectrum.
Figure 6:
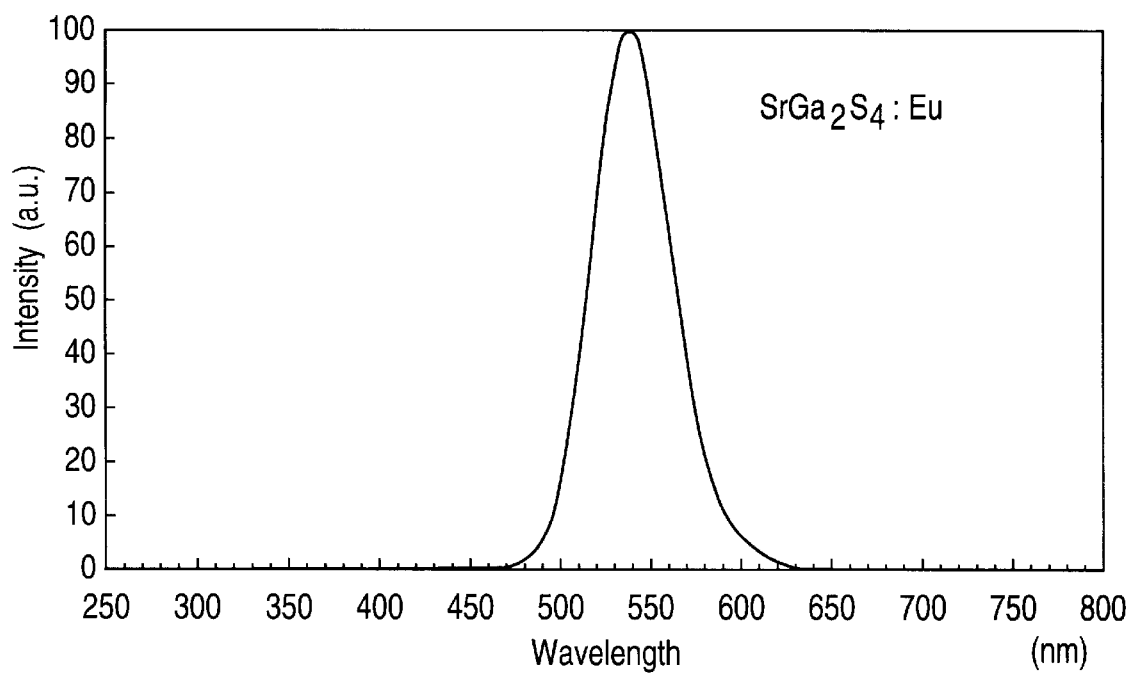
FIG. 6 is a fluorescent material emission spectrum.

Light wavelength spectra of the fluorescent materials are shown in FIG. 5 and FIG. 6. These two kinds of fluorescent material give red and green light, and the LED gives blue light. Light of these three different wavelengths can be combined to give white light. The fluorescent materials herein, which efficiently emit red and green light were not known in the past. The inventors discovered that while sulfide fluorescent materials give good results, sulfides are highly reactive with water, making techniques for isolating the fluorescent material from water crucial. The present invention features the use of sol-gel glass that is highly resistant to moisture in order to isolate water sensitive sulfide fluorescent materials from water.

The glass coating is impervious to water, allowing sulfide fluorescent materials to be used.

The light-emitting device herein differs from the prior art in that the light-emitting element is mounted on the substrate in a flip-chip arrangement. Selecting a hard material as the packaging material is desirable since the element structure will be able to handle greater stresses. By combining a flip-chip arrangement with a fluorescent material glass encapsulation technique, LED packaging of more reliable construction for practical purposes may be achieved.

What is claimed is:

1. A light-emitting device comprising:
   a substrate;
   electrical terminals disposed on a surface of said substrate;
   a light-emitting semiconductor device disposed above said substrate surface, said of said substrate;
   electrodes disposed on said bottom side of said light-emitting semiconductor device and electrically connected to said terminals on said substrate and said light-emitting semiconductor device being electrically connected to said terminals as a flip chip; and
   a glass layer arranged in a path of output light emitted by said light-emitting semiconductor device from an obverse top side thereof, said glass layer containing fluorescent material that converts at least a portion of said output light to converted light having a wavelength different from a wavelength of said output light.

2. The light-emitting device according to claim 1 wherein said substrate is a printed board.

3. The light-emitting device according to claim 1 wherein said fluorescent material comprises at least one sulfur-containing composition, each composition producing converted light of a different wavelength.

4. The light-emitting device according to claim 3 wherein one of said compositions comprises SrS:$Eu^{2+}$ and emits red fluorescent light, and another of said compositions comprises (Sr, Ba, Ca)$Ga_2S_4$:$Eu^{2+}$ and emits green fluorescent light.

5. The light-emitting device according to claim 4 wherein said composition that outputs green fluorescent light comprises $SrGa_2S_4$:$Eu^{2+}$.

6. The light-emitting device according to claim 1 wherein said glass layer containing said fluorescent material has a thickness of 100 $\mu$m or less.

7. The light-emitting device according to claim 1 further comprising a submount disposed between said light-emitting semiconductor device and said substrate, wherein said electrodes are electrically connected to said terminals via said submount.

8. The light-emitting device according to claim 1 wherein said glass layer comprises $SiO_2$.

9. The light emitting device of claim 8 wherein said glass layer further comprises at least one compound selected from the group consisting of PbO, $Ga_2O_3$, $Bi_2O_3$, CdO, ZnO, BaO, and $Al_2O_3$.

10. The light-emitting device of claim 1 wherein said output light and said converted light are used to produce white light.

11. The light-emitting device of claim 1 wherein said light-emitting semiconductor device comprises GaN.

12. The light-emitting device of claim 1 wherein said glass layer has a refractive index greater than about 1.5.

13. The light-emitting device of claim 1 wherein a concentration of said fluorescent material in said glass layer increases with distance from said light-emitting semiconductor device.

14. The light-emitting device of claim 1 wherein said glass layer overlies at least portions of said light-emitting semiconductor device.

15. A light-emitting device comprising:

a light-emitting semiconductor device; and a hard gel glass layer formed by a sol-gel process, and arranged in a path of output light emitted by said light-emitting semiconductor device, said glass layer containing fluorescent material that converts at least a portion of said output light to converted light having a wavelength different from a wavelength of said output light.

16. The light-emitting device of claim 15, wherein one of said fluorescent materials comprises (Sr, Ba, Ca)$Ga_2S_4$:$Eu^{2+}$.

17. The light-emitting device of claim 15 wherein said output light and said converted light are used to produce white light.

18. The light-emitting device of claim 15 wherein said light-emitting semiconductor device comprises GaN.

19. The light emitting device of claim 15 wherein said hard gel glass layer comprises at least one compound selected from the group consisting of PbO, $Ga_2O_3$, $Bi_2O_3$, CdO, ZnO, BaO, and $Al_2O_3$.

20. The light-emitting device of claim 15 wherein said hard gel glass layer overlies at least portions of said light-emitting semiconductor device.

* * * * *